United States Patent [19]

Katagiri et al.

[11] Patent Number: 5,707,749
[45] Date of Patent: Jan. 13, 1998

[54] METHOD FOR PRODUCING THIN FILM MULTILAYER WIRING BOARD

[75] Inventors: Junichi Katagiri, Ibaraki-ken; Akio Takahashi, Hitachiota; Akira Nagai, Hitachiota; Haruo Akahoshi, Hitachi; Kouji Fujisaki, Hitachi; Akio Mukoh, Mito; Fumiyuki Kobayashi, Sagamihara, all of Japan

[73] Assignee: Hitachi, Ltd., Tokyo, Japan

[21] Appl. No.: 494,974

[22] Filed: Jun. 26, 1995

Related U.S. Application Data

[60] Division of Ser. No. 097,060, Jul. 27, 1993, abandoned, which is a continuation-in-part of Ser. No. 800,078, Nov. 29, 1991, abandoned.

[30] Foreign Application Priority Data

Nov. 30, 1990 [JP] Japan ................... 2-329064

[51] Int. Cl.$^6$ ................ B32B 7/12; B32B 27/00
[52] U.S. Cl. ............ 428/473.5; 29/852; 174/259; 174/266; 428/354; 428/355
[58] Field of Search ............. 428/473.5, 209, 428/354, 355; 29/830, 852; 174/259, 266; 156/253, 280; 219/121.7, 121.71

[56] References Cited

U.S. PATENT DOCUMENTS

| 3,436,819 | 4/1969 | Lunine ................ 29/625 |
| 4,933,045 | 6/1990 | DiStefano et al. ........ 156/630 |
| 5,055,343 | 10/1991 | Murphy ................ 428/209 |

OTHER PUBLICATIONS

Jap-A-2-45998; Feb. 15, 1990 Hitachi K.K.

J.P.-A-2-94594 Apr.05, 1990 Hitachi Ltd.

*Primary Examiner*—Daniel Zirker
*Attorney, Agent, or Firm*—Antonelli, Terry, Stout, & Kraus, LLP

[57] ABSTRACT

A thin film multilayer wiring material excellent in reliability, yield, productivity, and higher positioning accuracy includes an insulation organic film having a wiring pattern on one surface and an adhesive layer on another principal surface. The insulation organic film is a polyimide film having a heat resistance at a pyrolysis beginning temperature of 350° to 550° C., a dielectric constant of 3.5-2.2 and a flame retardance of V-0 or V-1 according to the UL-94 standard. The adhesive layer contains an ether bismaleimide compound.

4 Claims, 4 Drawing Sheets

1

METHOD FOR PRODUCING THIN FILM MULTILAYER WIRING BOARD

CROSS-REFERENCE TO RELATED APPLICATION

This application is a Divisional application of application Ser. No. 08/097,060, filed Jul. 27, 1993 now abandoned, which application is a Continuation-In-Part application of Ser. No. 07/800,078, filed Nov. 29, 1991 (now abandoned).

BACKGROUND OF THE INVENTION

This invention relates to a thin film multilayer wiring board, a method for producing the same and an insulation organic film for use in the thin film multilayer wiring board.

Hitherto, multilayer wiring boards have been produced by sequential lamination, i.e. by sputtering a conductor metal to form a pattern, then forming an insulation film thereon, making through-holes through the insulation film, and again forming a conductor metal layer (JP-A-2-94594).

Furthermore, a thin film multilayer wiring board prepared by laminating films having wiring patterns on both sides through adhesive films is proposed (JP-A-2-45998).

In the above-mentioned sequential lamination, steps of forming wiring patterns, forming an insulation film and forming through-holes must be successively carried out, and although the sequential lamination is distinguished in accuracy of circuit wiring, yield is low and a long time is required for the production, which are serious problems in the improvement of lamination productivity. As a means for improving the yield, it is proposed to laminate films having wiring patterns on both sides through adhesive films. However, the proposed lamination method has also a serious trouble in the improvement of reliability of multilayer wiring boards, because it is difficult to position the wiring pattern layers with high accuracy, as compared with the sequential lamination.

SUMMARY OF THE INVENTION

An object of the present invention is to provide a method for producing a thin film multilayer wiring board distinguished in its reliability which is capable of solving the yield problem with good productivity and of improving a positioning accuracy of wiring pattern layers.

The gist of the present invention will be explained below.

The first aspect of the present invention is to provide a method for producing a thin film multilayer wiring board. That is, the method according to the first aspect of the present invention comprises a step (A) of positioning an insulation organic film having a wiring pattern on one surface in proximity to a substrate for a multilayer wiring board on which a circuit is provided, thereby aligning the wiring pattern of the insulation organic film with the circuit on the substrate and bonding, through an adhesive layer, another principal surface of the insulation organic film to the substrate and a step (B) of forming through-holes through the insulation organic film and the adhesive layer, a step (C) of making the through-holes conductive by plating, a step (D) of bonding, through an adhesive layer, the surface layer obtained in the step (C) to a principal surface of an insulation organic film having a wiring pattern on another surface, and a step (E) of positioning the wiring pattern on the insulation organic film used in the step (D) to the surface circuit layer obtained in the step (C) for making connection therebetween and forming through-holes through the insulation organic film and the adhesive layer, at least one run of the above steps (C), (D), and (E) being repeated.

The second aspect of the present invention to provide a method further comprising repeating at least one run of a step (F) of bonding, through an adhesive layer, a surface of an insulation organic film (a first layer) having a wiring pattern on another surface to a surface of an insulation organic film (a second layer) having a wiring pattern on one surface on which another layer is to be formed, a step (G) of positioning the wiring pattern of the first layer to the wiring pattern of the second layer for making connection therebetween and forming through-holes through the insulation organic film of the first layer and the adhesive layer, and a step (H) of making the through-holes conductive by plating, thereby forming a thin film multilayer wiring material having a plurality of wiring pattern layers, then bonding, through an adhesive layer, a substrate to one principal surface of the thin film multilayer wiring material on which the wiring pattern layers are not formed, positioning the circuit on the substrate to the wiring pattern layers of the thin film multilayer wiring material for making connection therebetween and forming through-holes therethrough, and bringing the through-holes into an electrical connection.

The third and fourth aspects of the present invention comprise carrying out the methods of the first and second aspects of the present invention with the thin film wiring material comprising an insulation organic film having a wiring pattern on one surface and an adhesive layer on another principal surface, respectively.

The fifth aspect of the present invention is to provide a thin film wiring material comprising an insulation organic film having a wiring pattern layer on one surface and an adhesive layer on the other principal surface.

The sixth aspect of the invention is to provide a method for producing the thin film wiring material of the fifth aspect of the present invention.

DETAILED DESCRIPTION OF THE DRAWINGS

FIGS. 1A to 1D show one embodiment given in Example 1.

Figure 1A:
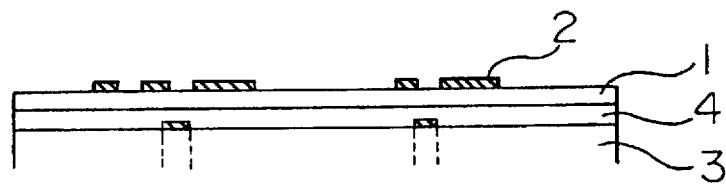
FIGS. 1A, 1A', 1B, 1C, 1D, 2A–2C and 3A–3C show sequence of the steps according to embodiments of the present invention

FIG. 1A shows a metal-lined film 1, prepared by applying a varnish to a metallic foil 2', followed by heating to cure the varnish to form a film 1.

FIG. 1A' shows a laminate prepared by forming a patterned resist (not shown in the drawing) on the open side of the metallic foil 2', followed by light exposure, development etching, whereby a wiring pattern 2 is formed from the metallic foil 2' on the film 1, then plasma treating the other side of the film 1 and placing the plasma-treated side of the film onto a substrate 3 having a wiring pattern 12 on the surface through an adhesive layer 4, while aligning the wiring pattern 2 to the wiring pattern 12 (circuit) by a mask aligner, followed by tentative adhesion by an ultraviolet lamp or the like or by partially heated pressing, and then by heated pressing in an autoclave to bond the film 1 to the substrate 3.

Figure 1B:
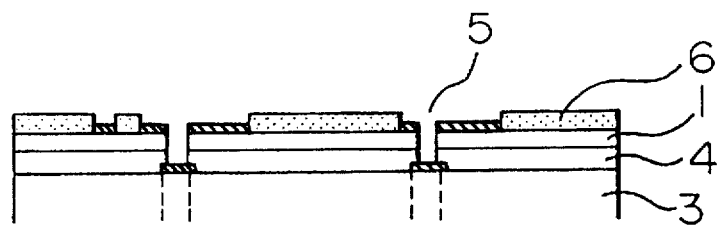

FIG. 1B shows through-holes 5 made at desired positions by forming a mask pattern thereon by mask imaging process or contact mask process using a metallic or dielectric mask or the like, while positioning the mask pattern to other positions than those for the desired through-holes followed by irradiation of excimer laser, and formation of a resist pattern 6 for chemical (electroless) plating, followed by light exposure and development, while positioning the resist according to a pattern mask so as to prevent chemical (electroless) plating on plating-unwanted positions.

Figure 1C:
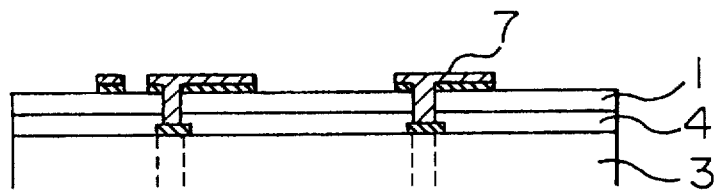

FIG. 1C shows platings 7 provided in the through-holes 5 by chemical plating to make the wiring pattern 2 on the film 1 and the wiring pattern 12 on the substrate conductive to each other, where the thickness of the platings 7 can be adjusted as desired. After the electroless plating, the resist 6 is removed.

Figure 1D:
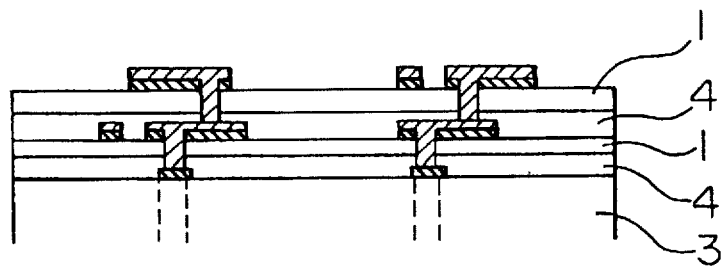

FIG. 1D shows a thin film multilayer substrate obtained by repetitions of the foregoing steps.

Figure 2A:
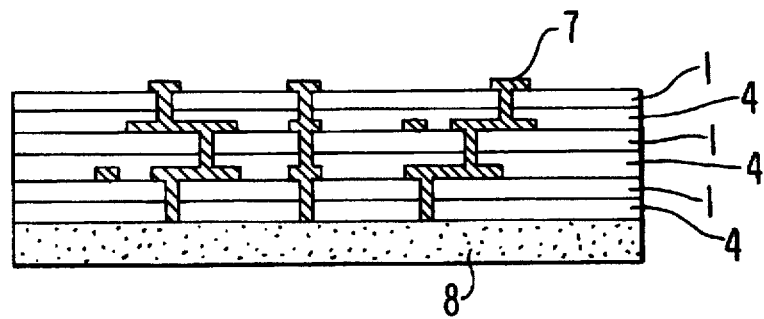
Figure 2B:
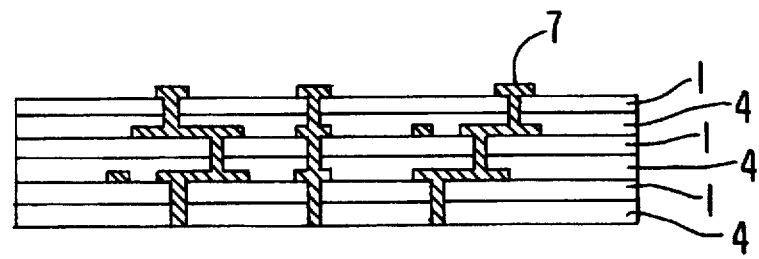
Figure 2C:
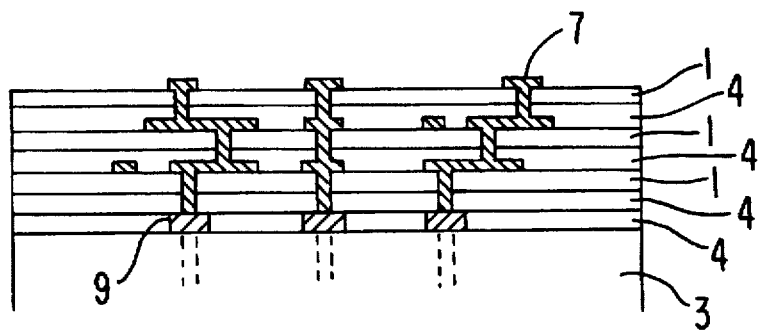

FIGS. 2A to 2C show another embodiment of the present invention.

FIG. 2A shows a thin film multilayer laminate with a desired number of layers formed on a provisional substrate 8 of glass or the like in the same manner as given in FIGS. 1A to 1D.

FIG. 2B shows the thin film multilayer laminate freed from the provisional substrate 8.

FIG. 2C shows the thin film multilayer laminate of FIGS. 2B placed on a substrate 3 having eutectic solders 9 as a wiring pattern while positioning the laminate and the substrate 2 to make the wirings 7 conductive with the eutectic solders 9 on the substrate 3, followed by heated pressing. Owing to the provision of the adhesive layers 4 uniform pressing can be obtained, and also the deviation between the thin film multilayer laminate and the substrate can be prevented at the same time.

Figure 3A:
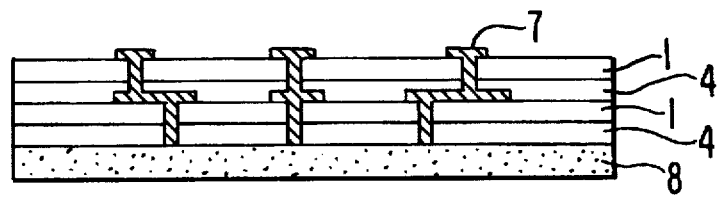
Figure 3A:
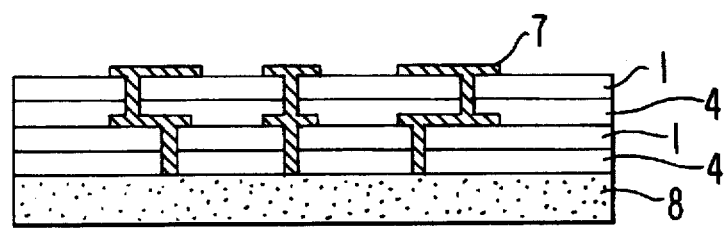
Figure 3B:
Figure 3B:
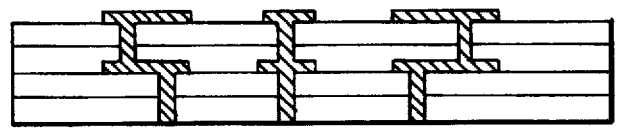
Figure 3C:
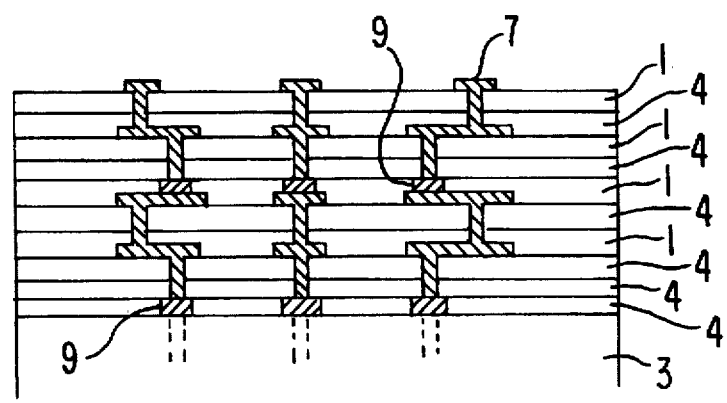

FIGS. 3A to 3C shows other embodiment of the present invention.

FIG. 3A shows two thin film multilayer laminates each with desired number of layers and varied wiring patterns formed each on a provisional substrate 8 in the same manner as in FIG. 2A.

FIG. 3B shows the thin film multilayer laminates freed form the provisional substrate 8 in the same manner as in FIG. 2B.

FIG. 3C shows the thin film multilayer laminates of FIG. 3B integrated into one body through eutectic solders 9 therebetween on a common substrate 3 having eutectic solders 9 as a wiring pattern while positioning the laminates and the substrate 3 to make wirings 7 of both laminates conductive with the eutectic solders 9 on the substrate, followed by heated pressing.

The insulation organic films for use in the present invention are polymer films with such characteristics as a heat resistance (pyrolysis beginning temperature) of 350° to 550° C., a dielectric constant cf 3.5 to 2.2, a flame retardance (according UL-94 standard) of V-0 or V-1, a thermal expansion coefficient of not more than $2.0 \times 10^5 /°C$., and a thickness of 1 to 100 μm. Examples of effective polymer films include polyimide, polyetherimide, polyesterimide, polyamideimide, polyether ether ketone, polysulfone, polycarbonate, liquid crystal polymer and polyfluorocarbon. Polyimide film is especially effective for satisfying the above-mentioned characteristics.

Polyamic acids are generally used as the polyimides or precursors thereof in the present invention. Furthermore, esterified amic acids and reaction products of carboxylic dianhydrides with diisocyanates can be also used. As skeletons thereof, for example, polymers of aromatic aminocarboxylic acids and those obtained from aromatic diemines or diisocyanates and aromatic tetracarboxylic acids as starting materials can be used.

The precursors of polyimides can be obtained by homopolymerization of aromatic aminodicarboxylic acid derivatives or reaction of aromatic diemines or aromatic isocyanates with tetracarboxylic acid derivatives. The tetracarboxylic acid derivatives include, for example, esters, carboxylic dianhydrides and acid chlorides. Carboxylic acid dianhydrides are preferred from the viewpoint of synthesis.

The synthesis reaction is generally carried out at −20° to 200° C. in a solvent such as N-methylpyrrolidone, dimethylformamide, dimethytacetamide, dimethylsulfoxide, dioxanet tetrahydrufuran, or acetophenone.

Examples of the aminodicarboxylic acid derivatives include 4-aminophthalic acid, 4-amino-5-methylphthalic acid, 4-(p-anilino)phthalic acid, 4-(3,5-dimethyl-4-anilino) phthatic acid, and esters, acid anhydrides and acid chlorides thereof.

The aromatic diamines for use in the present invention include, for example, those having a linear conformation such as p-phenylenediamine, 2,5-diaminotoluene, 2,5-diaminoxylene, diaminodurene (2,3,5,6-tetramethylphenylenediamine), 2,5-diaminobenzotrifluoride, 2,5-diaminoanisole, 2,5-diaminoacetophenone, 2,5-diaminobenzophenone, 2,5-diaminodiphenyl, 2,5-diaminofluorobenzene, benzidine, o-tolidine, m-tolidine, 3,3',5,5'-tetramethytbenzidine, 3,3'-dimethoxybenzidine, 3,3'-di(trifluoromethyl)benzidine, 3,3'-diacetylbenzidine, 3,3'-difluorobenzidine, octafluorobenzidine, 4,4'-diaminoterphenyl, and 4,41-diaminoquaterphenyl; m-phenylenediamine, 4,4'-diaminodiphenylmethane, 1,2-bis(anilino)ethane, 4,4'-diaminodiphenyl ether, diaminodiphenyl sulfone, 2,2'-bis(p-aminophenyl)propane, 2,2'-bis-(p-aminophenyl) hexafluoropropane, 3,3'-dimethyl-4,4'-diaminodiphenyl ether, 3,3'-dimethyl-4,4'-diaminodiphenylmethane, diaminotoluene, diaminobenzotrifluoride, 1,4-bis(p-aminophenoxy)benzene, 4,4'-bis(p-aminophenoxy)-biphenyl, hexafluoropropane, 2,2'-bis{4-(p-amino-phenoxy) phenyl}propane, 2,2'-bis{4-(m-aminophenoxy)-phenyl}proprane, 2,2'-bis{4-(p-aminophenoxy)phenyl}-hexafluoropropane, 2,2'-bis{4-(m-aminophenoxy)phenyl}-hexafluoropropane, 2,2'-bis{4-(p-aminophenoxy)-3, 5dimethylphenyl}hexafluoropropane, 2,2'-bis{4-(p-aminophenoxy)-3,5-ditrifluoromethylphenyl}hexafluoropropane, p-bis(4-amino-2-trifluoromethylphenoxy)benzene, 4,4'-bis (4-amino-2-trifluoromethylphenoxy)biphenyl, 4,4'-bis(4-amino-2-trifluoromethylphenoxy)biphenyl sulfone, 4,4'-bis (3-amino-5-trifluoromethylphenoxy)-biphenyl sulfone, 2,2'-bis{4-(p-amino-3-trifluoromethylphenoxy) phenyl}hexafluoropropane, diaminoanthraquinone, 4,4'-bis (3-aminophenoxyphenyl)diphenyl sulfone, 1,3-bis(anilino) hexafluoropropane, 1,4-bis(anilino)-octafluorobutane, 1,5-bis(anilino)decafluoropentane, 1,7-bis(anilino) tetradecafluoroheptane, and diaminosiloxanes represented by the following formula:

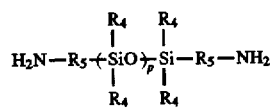

-continued or

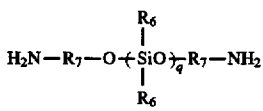

wherein $R_4$ and $R_6$ each represents a monovalent organic group, $R_5$ and $R_7$ each represents a divalent organic group, and p and q each represents an integer of more than 1. Diisocyanate compounds thereof can also be used.

The tetracarboxylic acid derivatives for use in the present invention include, for example, pyromellitic acid, methylpyromellitic acid, dimethylpyromeltitic acid, di(trifluoromethyl)pyromellitic acid, 3,3',4,4'-biphenyltetracarboxylic acid, 5,5'-dimethyl-3,3',4,4'-biphenyltetracarboxylic acid, p-(3,4-dicarboxyphenyl)benzene, 2,3,3',4-tetracarboxydiphenyl, 3,3',4,4'-tetracarboxydiphenyl ether, 2,3,3',4-tetracarboxydiphenyl ether, 3,3',4,4'-tetracarboxybenzophenone, 2,3,3',4-tetracarboxybenzophenone, 2,3,6,7-tetracarboxynaphthalene, 1,4,5,7-tetracarboxynaphthalene, 1,2,5,6-tetracarboxynaphthalene, 3,3',4,4'-tetracarboxydiphenylmethane, 2,3,3',4-tetracarboxydiphenylmethane, 2,2-bis(3,4-dicarboxyphenyl)propane, 2,2-bis(3,4-dicarboxyphenyl)hexafluoropropane, 3,3',4,4'-tetracarboxydiphenyl sulfone, 3,4,9,10-tetracarboxyperlyene, 2,2'-bis{4-(3,4-dicarboxyphenoxy)-phenyl}propane, 2,2'-bis{4-(3,4-dicarboxyphenoxy)phenyl}hexafluoropropane, butanetetracarboxylic acid, and cyclopentanetetracarboxylic acid. Acid anhydrides, acid chlorides and esters thereof can also be used.

More specifically, polyimide films containing repeated structures represented by the following formula are especially effective.

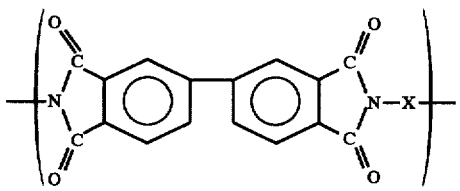

wherein X represents an aromatic diamine residue.

In the present invention, the polyimides not completely imidized are preferable from the viewpoint of adhesiveness. A polyimide precursor film can be obtained by uniformly applying a solution of the polyimide precursor, for example, by spin coating and drying preferably at about 50° to 250° C. In case of using the polyimide precursor film, it is desirable to heat the film at a high temperature to convert it to polyimide or to dip the film in a solution of an imidizing agent to imidize it. When the imidization is carried out by heating, it is desirable to heat the film to at least the glass transition temperature of the polyimide produced.

In the present invention, when diamines having a linear conformation are used as a diamine component and pyromellitic acid derivatives or biphenyl tetracarboxylic acid derivatives are used as tetracarboxylic acids, rodlike polyimides low in the thermal expansion coefficient can be obtained with such advantages that Si chips can be directly attached.

In the present invention, the film may be formed in advance and then a conductive film may be formed thereon, but it is also possible to coat a conductor such as a metallic foil with a varnish, cure the varnish and then form a conductor pattern. In that case, adhesiveness of polyimide to various substrate materials will be a problem. The surface of inorganic substrate material may be roughened or a surface treating agent such an a silane coupling agent, a titanate coupling agent, an aluminum alcoholate, an aluminum chelate, a zirconium cholate, or an aluminum acetylacetone may be added to the polyimide.

Powders of inorganic materials, organic materials or metals or fibers may also be added to the polyimide to lower the thermal expansion coefficient, or increase the modulus or control the flowability.

In the present invention the insulation organic film laminated with a metallic foil on one surface by an adhesive, followed by pattern formation or a film of the above-mentioned polymer formed by directly applying the polymer to a metallic foil and then forming a wiring pattern thereon can be used. In order to reduce the thermal stress developed at the interface between the insulation organic film and a metal such as copper as a wiring pattern material it is important that the insulation organic film has a heat resistance (pyrolysis beginning temperature) of at least 350° C., a dielectric constant of 3.5 to 2.2 and a thermal expansion coefficient of $2.0 \times 10^{-5}$/°C. or less.

In the present invention, a wiring pattern on one surface of the insulation organic film can be formed by etching an insulation organic film having a metallic foil on one surface or by conducting sputtering or plating on one surface of the organic film. In that case, light exposure, development and heat treatment are carried out with a photosensitive material and thereafter conduction treatment is carried out by plating, etc. This method is effective for formation of pattern of 40 μm or less especially 10 to 40 μm, in both wiring line thickness and wiring line width. Furthermore, the resulting wiring pattern is distinguished in the smoothness and processability.

For the adhesive layer, for example, a half-cured polyimide film of polyimide, a heat-curable film composed of polyimide and polymaleimide, silicone resin, epoxy resin and a thermotropic liquid crystal film having polymerization-reactive functional groups, a film coated with an adhesive on the surface, nonwoven fabrics impregnated with an adhesive, glass cloth, reinforcing fibrous materials such as fluorine-based fibers, and a varnish type adhesive can be used. Especially, an adhesive containing an ether bismaleimide compound represented by the following formula is effective for reducing the thermal stress, decreasing the dielectric constant and maintaining the heat resistance and adhesiveness.

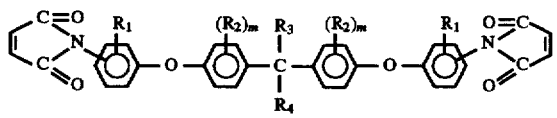

wherein $R_1$ is H, a lower alkyl group or a lower fluoroalkyl group; $R_2$ is H, a lower alkyl group or a lower fluoroalkyl group, m is an integer of 1 to 4; and $R_3$ and $R_4$ are $CH_3$ or $CF_3$ and may be identical with or different from each other.

Method for producing a thin film multilayer wiring board according to the present invention will be explained below.

After checking a wiring pattern formed on one surface of an organic film, the film is subjected to positioning to a ceramics substrate or the like and is bonded to the substrate by a vacuum press or in an autoclave. Bonding temperature is 300° C. or lower, preferably 250° C. or lower. Above 300°

C., occurrence of warping of the substrate or poor dimensional stability during the lamination is a problem. Through-holes can be formed, for example, by excimer laser, $CO_2$ gas laser, EB (electron beam), plasma etching, or photoetching. In the present invention, it is desirable to make through-holes by a laser beam, thereby improving the productivity. Furthermore, chemical plating or electroplating can be used to make the through-holes conductive. Line width and line thickness of the pattern must have a specific size from the viewpoint of characteristic impedance and higher density, and the thickness of pattern must be controlled at the same time as the through-holes are made conductive. In the present invention, both line thickness and line width are preferably 40 µm or less, more preferably 10 to 40 µm. Furthermore, filling of through-holes with a conductive paste or a low melting metal such as a soldering material can be also used as a means of making the through-holes conductive.

In the present invention, multilayer structure is formed either by successfully laminating organic films having a wiring pattern on the surface on the surface of a substrate or by sequentially laminating a given number of organic films on a provisional substrate such as a metal plate and thereafter separating the laminate from the provisional substrate, and bonding the separated laminate to a surface of a substrate of, e.g. ceramics as shown in FIGS. 2A to 2C and FIGS. 3A to 3C. In that case, positioning accuracy is very important. A high positioning accuracy can be obtained by providing an organic film on a substrate by suction through an adhesive material in a similar apparatus to a mask aligner and then bonding the film to the substrate by pressing after making the adhesive material adhesive by high-frequency heating or laser heating and, in case of using a photosensitive material, by exposing the photosensitive material to light, thereby once lightly bonding the organic film to the photosensitive material, followed by lamination on the substrate in the same manner as above. Full curing can be carried out at that time or later after lamination of all the layers.

PREFERRED EMBODIMENTS OF THE INVENTION

The present invention will be explained in detail below, referring to examples.

EXAMPLE 1

A copper foil (12-µm thick) 2' was coated with N-methyl-2-pyrrolidone varnish of polyamic acid obtained by reacting p-phenylenediamine, pyromellitic dianhydride and 3,3',4,4'-biphenyltetracarboxylic dianhydride in a molar ratio of 1:0.5:0.5 and the coated copper foil 2' was heated at 120° C. for 30 minutes and then at a temperature of 120° C. to 400° C. over a period of 2 hours in a nitrogen gas containing 2% by volume of hydrogen and further heated at 400° C. for 10 minutes to obtain a film 1 provided with a copper film on one side. The resulting polyimide had a thermal expansion coefficient of $1.0 \times 10^{-5}$/°C., a dielectric constant of 3.5, a heat resistance (pyrolysis beginning temperature) of 510° C., and a thickness of 25 µm. The film 1 was then subjected to patterning by photolithography to form a wiring pattern 2. Then, a photo-curable methacrylate ester-terminated silicone resin film was formed as an adhesive material to a thickness of about 20 µm on both sides of another polyimide film for an adhesive layer 4 having a thermal expansion coefficient of $1.0 \times 10^{-5}$/°C., prepared from p-phenylenediamine and 3,3',4,4'-biphenyltetracarboxylic dianhydride as raw materials. The polyimide surface of the polyimide film 1 having the wiring pattern 2 formed above was subjected to a plasma treatment and the thus plasma-treated polyimide film was placed on a mullite substrate 3 having a thermal expansion coefficient of $6 \times 10^{-6}$/°C. through the adhesive layer 4 while making positioning to align the wiring pattern 2 to the wiring pattern 12 (circuit) on the substrate 3 by a mask aligner, followed by exposing the laminate to ultraviolet rays, thereby making bonding therebetween. Then, the laminate was heated and bonded under pressure in an autoclave at 150° C. for 5 hours (FIG. 1A'). Then, through-holes 5, about 40 µm in diameter, were made at the predetermined positions through the resist pattern 6 by excimer laser (FIG. 1B) and chemically plated to make the through-holes 5 conductive with the wiring pattern (circuit) 12 on the mullite substrate 3 (FIG. 1C), and simultaneously a chemically plated wiring pattern 7, 40 µm in line width and 35 µm in line thickness, was obtained. The same procedure as above was repeated to form a multilayer wiring board in six layers (FIG. 1D). The desired thin film multilayer wiring board was thus obtained.

EXAMPLES 2 and 3

Thin film multilayer wiring boards were obtained in the same manner as in Example 1 except that a polyimide film clad with a copper foil (18-µm thick) by an acrylic adhesive and a polyether imide film clad with a copper foil (18-µm thick) by an epoxy adhesive were used as the insulation organic films.

EXAMPLE 4

An adhesive film was obtained from N,H'-(4,4'-diphenylmethane)bismaleimide and a polyimide prepared from p-phenylene diamine and 3,3',4,4'-biphenyltetracarboxylic dianhydride. Thin film multilayer wiring boards were prepared in the same manner as in Example 1 except that the above adhesive films were used, respectively, and heat cured by a vacuum press at 250° C. for 1 hour.

EXAMPLE 5

An adhesive film was obtained from 2,2-bis{4-(4-maleimidophenoxy)phenylpropane and a polyimide prepared from p-phenylene diamine and 3,3',4,4'-bisphenyltetracarboxylic dianhydride. A thin film multilayer wiring board was prepared in the same manner as in Example 1 except that the above adhesive film was used and heat cured by a vacuum press at 230° C. for 1 hour.

EXAMPLE 6

A thin film multilayer wiring board was obtained in the same manner as in Example 1 except that polyimide-based cover coat ink (SPI-200, trademark of a product made by Shinnittetsu Chemical Co., Ltd., Japan) as an adhesive material was applied to the substrate and dried at 130° C. for 3 minutes and the resulting substrate was clad with the film having a wiring pattern, followed by heat curing at 200° C. for 5 minutes by a vacuum press.

EXAMPLE 7

A thin film multilayer wiring board was obtained in the same manner as in Example 2 except that a flat sheet, prepared by subjecting to plasma treatment the surface of a polyimide of low thermal expansion (polyimide having a thermal expansion coefficient of $1.0 \times 10^{-5}$/°C., a dielectric constant of 3.5 and a heat resistance of 510° C., prepared from p-phenylenediamine and 3,3',4,4'-biphenyltetracarboxylic dianhydride) and then to a treatment with a colloidal Pd catalyst suspension, then to coating with a photosensitive polyimide, followed by light exposure, development and heating, and then to forming of a wiring pattern by chemical plating and electroplating, was used.

EXAMPLE 8

A thin film multilayer wiring board was obtained in the same manner as in Example 1 except that an organic film having a copper foil, 18 µm thick, on one side and a polyimide adhesive on another side was used and heating under pressure was carried out at 250° C. for 30 minutes.

EXAMPLE 9

As an organic film, a polyimide film having a copper foil, 12 µm thick, the polyimide film was a dehydration condensation reaction product of p-phenylenediamine and 3,3',4,4'-biphenyltetracarboxylic dianhydride and had a thermal expansion coefficient of $1.0\times10^{-5}/°C$. a heat resistance of 510° C., and a thickness of 25 µm) was subjected to patterning by photolithography to form a wiring pattern, 20 µm in line width. The polyimide surface of the polyimide film was subjected to a plasma treatment and was subjected to positioning to a mullite substrate having a thermal expansion coefficient of $6\times10^{-6}/°C$. through the following adhesive material (A) by a mask aligner, followed by lamination aid bonding by exposure to ultraviolet rays. Then, through-holes, about 20 µm in diameter, were made at the predetermined positions by excimer laser and were made conductive by chemical plating and a pattern, 25 µm in line thickness, was formed. This procedure was repeated through the adhesive material to form a multilayer wiring board with 26 layers, which was finally heat cured at 150° C. for 5 hours to obtain the desired thin film multilayer wiring board.

Preparation of adhesive material (A)

1.0 mole of p-phenylenediamine was reacted with 1.0 mole of 3,3',4,4'-biphenyltetracarboxylic dianhydride in N-methylpyrrolidone (NMP) to obtain a 3% solution of polyamic acid, with a structural unit (polyimide precursor) represented by the following formula. To the solution was added a 3% solution of N,N'-(4,4'-diphenyl ether) bismaleimide in NMP.

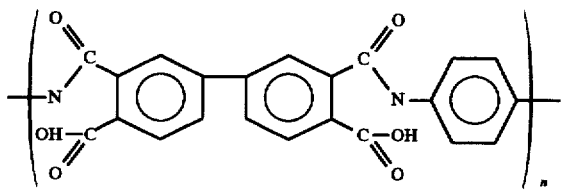

Then, the polyamic acid and bismaleimide mixed solution was applied to a glass substrate and then dehydration condensation reaction was carried out at 350° C. for 5 hours to obtain a polyimide film (A-imide), 20 µm thick, with a thermal expansion coefficient of $1.0\times10^{-6}/°C$. and the following structural unit:

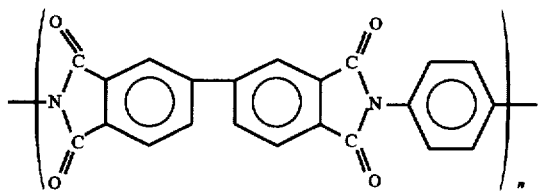

Then, a silicone resin having terminal methacrylate groups was applied to both sides of the above polyimide film to a thickness of about 20 µm and dried to form an adhesive layer.

EXAMPLE 10

As an organic film, a polyimide film having a copper foil, 12 µm thick, on one side (the polyimide was a dehydration condensation reaction product of 0.6 moles of p-phenylenediamine and 0.4 moles of 4,4'-diaminodiphenyl ether as a diamine component with 1.0 mole of 3,3',4,4'-biphenyltetracarboxylic dianhydride and had a thermal expansion coefficient of $1.8\times10^{-5}/°C$., a dielectric constant of 3.8, a heat resistance of 480° C., and a thickness of 25 µm) was subjected to patterning by photolithography to form a wiring pattern, 20 µm in width. Then, the polyimide surface of the polyimide film was subjected to a plasma treatment and to positioning to a glass substrate having a thermal expansion coefficient of $4.0\times10^{-5}/°C$. through the following adhesive material (B) by a mask aligner, followed by lamination and bonding. Then, through-holes, about 20 µm in diameter, were made at the predetermined positions by excimer laser and made conductive by chemical plating and a pattern, 25 µm in line thickness, was formed. This procedure was repeated through the adhesive material to form a multilayer wiring board with 35 layers, which was finally heat cured at 200° C. for 10 hours to obtain the desired thin film multilayer wiring board.

Preparation of adhesive material (B)

Both sides of the polyimide film (A-imide) used in preparation of adhesive material (A) was coated with a solution in NMP containing 1% by weight of a mixture consisting of the following addition reaction type unsaturated imide:

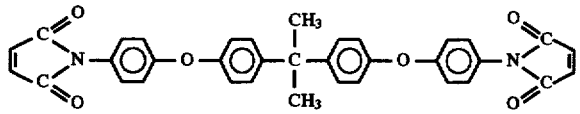

and a phenoxy resin (PKHH, trademark of a product made by Union Carbide Corp., USA) in a ratio by weight of the former to the latter of 8.5/1.5 to a thickness of 5 µm and dried.

EXAMPLES 11 and 12

Example 10 was repeated except that the following adhesive material (C) and the following adhesive material (D) were used.

Preparation of adhesive material (C)

Both sides of the polyimide film (A-imide) used in preparation of adhesive material (A) was coated with a 2% solution in NMP containing 2% by weight of a mixture consisting of N,N'-(4,4'-diphenylmethane)bismaleimide and polyvinyl butyral in a ratio by weight of the former to the latter of 8.0/2.0 to a thickness of 15 μm and dried.

Preparation of adhesive material (D)

Solution containing 1% by weight of 2,2-bis{4-(4-maleimidephenoxy)phenyl}hexafluoropropane in NMP was applied to one side of the polyimide (A-imide) used in preparation of the adhesive material (A) and a solution containing 1% by weight of a mixture consisting of 2,2-bis{(4-4-maleimidephenoxy)phenyl}hexafluoropropane and phenoxy resin PKHH in a ratio by weight of the former to the latter of 8.5/1.5 was applied to another side and dried.

Comparative Example (Conventional method)

Figure 4A:
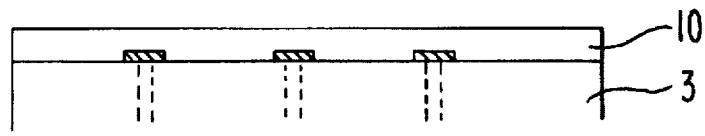
FIGS. 4A–4F show sequence of steps according to a conventional method, where the reference numeral 1 stand for an insulation organic film, 2 for a wiring pattern, 2' for a metallic foil, 3 for a substrate, 4 for an adhesive layer, 5 for a through-hole, 6 for a resist, 7 for a wiring pattern, 8 for a provisional substrate (metal, glass), and 9 for an eutectic solder.
Figure 4B:
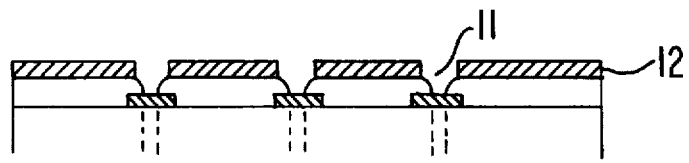
Figure 4C:
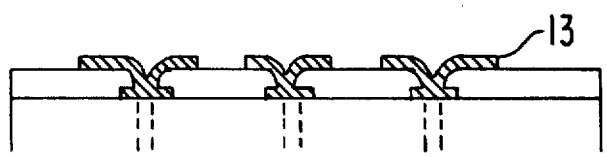
Figure 4D:
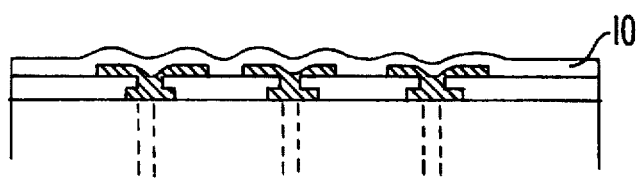
Figure 4E:
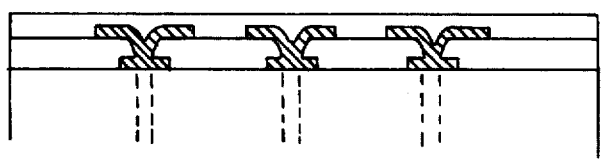
Figure 4F:
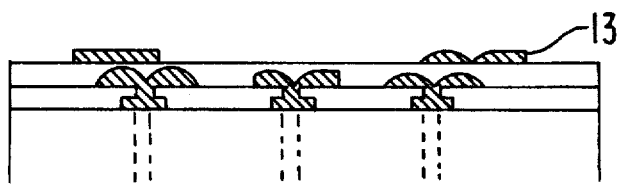

As shown in FIG. 4, a polyimide varnish was applied to ceramics substrate 3 having a wiring pattern and heat treated at 370° C. for 1 hour to form potyimide insulation layer 10 (FIG. 4A). Then, resist pattern 12 was formed on the desired portion and through-holes 11 were formed by etching (FIG. 4B). Then, a wiring metal was deposited by sputtering and then a resist pattern was provided on the portion which was to be a wiring and unnecessary metal was etched off to form a wiring pattern 13 (FIG. 4C). A polyimide varnish was further applied to the wiring pattern and heat treated to form an insulation layer, and at that time grinding was carried out for flatting the surface (FIG. 4D→FIG. 4E). This procedure was repeated to form a multilayer wiring board with mix layers (FIG. 4F) and the desired thin film multilayer wiring board was obtained.

Yield, production time and fluctuation in the interlayer thickness of thin film multilayer wiring boards prepared in Examples 1 to 8 and Comparative Example are shown in the following Table.

packages and module substrates for large-scale computers and supercomputers.

What is claimed is:

1. A thin film multilayer wiring material which comprises an insulation organic film having a wiring pattern layer on one principal surface and an adhesive layer on another principal surface; said insulation organic film being a polyimide film having a repeating structure represented by the following formula:

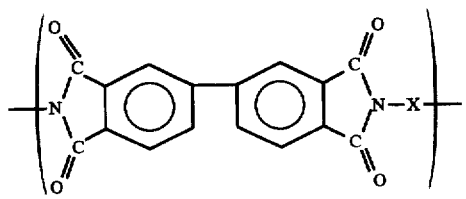

wherein X represents an aromatic diamine residue and the adhesive layer contains an ether bismaleimide compound represented by the following formula:

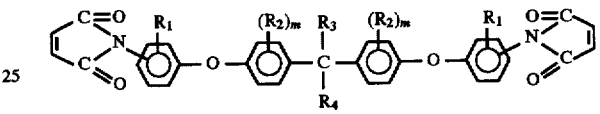

wherein $R_1$ represents a hydrogen atom, a lower alkyl group or a lower fluoroalkyl group, $R_2$ represents a hydrogen atom, a lower alkyl group or a lower fluoroalkyl group, m represents an integer of 1 to 4, and $R_3$ and $R_4$ each represents $CH_3$ or $CF_3$ and may be identical with or different from each other.

2. A thin film multilayer wiring materiel according to claim 1, wherein the insulation organic film comprises a polymer having a heat resistance at a pyrolysis beginning temperature of 350° to 550° C., a dielectric constant of 3.5-2.2, and a flame retardance of V-0 or V-1 according to the UL-94 standard.

TABLE

| Item | Example | | | | | | | | Comparative Example (Conventional method) |
|---|---|---|---|---|---|---|---|---|---|
| | 1 | 2 | 3 | 4 | 5 | 6 | 7 | 8 | |
| Yield of thin film multilayer wiring board | >60 | >60 | >60 | >60 | >60 | >60 | >60 | >60 | <10 |
| Production time* of thin film multilayer wiring board | <30 | <30 | <30 | <30 | <30 | <30 | <30 | <30 | 100 |
| Fluctuation in interlayer thickness of thin film multilayer wiring board | Substantially none | Substantially none | Substantially none | Substantially none | Substantially none | Substantially none | Substantially none | Substantially none | Much fluctuated |

*Relative to the conventional method as 100.

According to the present method for making a thin film multilayer wiring substrate of highly multiple layers, use of an organic film on which a wiring pattern is formed in advance facilitates to check the pattern and gives a remarkable effect on the yield and reliability. The thin film multilayer wiring board of the present invention is useful for 3. A thin film multilayer wiring material according to claim 1, wherein the insulation organic film has a thickness of 1 to 100 µm.

4. A thin film multilayer wiring material according to claim 1, wherein line thickness and line width of the wiring pattern formed on one surface of the insulation organic film are both 10 to 40 µm.

* * * * *